Figure 1:
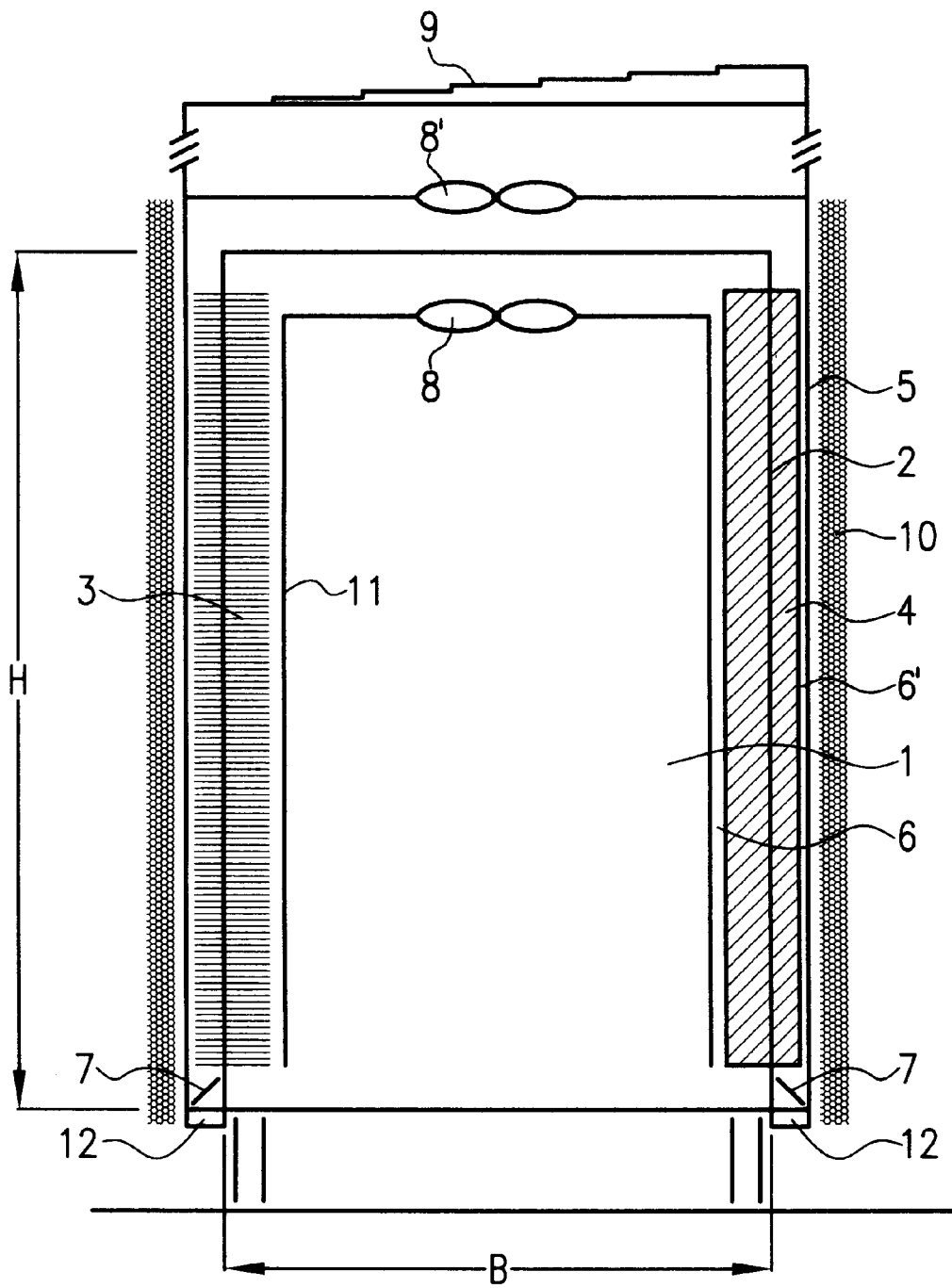

United States Patent [19]
Boehmer et al.

[11] Patent Number: 6,082,441
[45] Date of Patent: Jul. 4, 2000

[54] CABINET FOR ELECTRIC AND ELECTRONIC SYSTEMS

[75] Inventors: Peter Boehmer, Dresden; Rainer Bretschneider, Meissen; Herbert Hoenisch, Leuben, all of Germany

[73] Assignee: Knuerr-Mechanik Fuer Die Elektronik Aktiengellschaft, Munich, Germany

[21] Appl. No.: 09/202,276

[22] PCT Filed: Jun. 13, 1997

[86] PCT No.: PCT/DE97/01206

§ 371 Date: Dec. 11, 1998

§ 102(e) Date: Dec. 11, 1998

[87] PCT Pub. No.: WO97/48261

PCT Pub. Date: Dec. 18, 1997

[51] Int. Cl.[7] ...................................... H05K 7/20
[52] U.S. Cl. ................ 165/80.3; 165/129; 165/131; 174/16.1; 361/697
[58] Field of Search .................... 454/184, 909; 361/678, 690, 694, 695, 697; 174/51.1, 16.1, 16.3; 165/80.3, 122, 129, 131, 185

[56] References Cited

U.S. PATENT DOCUMENTS 5,263,537  11/1993  Plucinski et al. .
5,467,250  11/1995  Howard et al. ................... 165/122 X
5,513,071  4/1996  LaViolette et al. ............. 165/80.3 X
5,529,120  6/1996  Howard et al. ................. 174/16.3 X

FOREIGN PATENT DOCUMENTS 0 225 954    6/1987   European Pat. Off. .
1 135 065    8/1962   Germany .
  212 871    8/1984   Germany .
94 08 362   10/1994   Germany .
295 19 260 U 3/1996   Germany .
01129497     5/1989   Japan .
08116190     5/1996   Japan .

*Primary Examiner*—Harold Joyce
*Attorney, Agent, or Firm*—Larson & Taylor

[57] ABSTRACT

An equipment cabinet for an electrical and electronic system includes a functional area closed in dustproof and watertight manner and at least one door closing in dustproof and watertight manner. A multishell structure is provided round the functional area and comprises baffle plates, a functional area wall and an outer jacket. Between the baffle plates and functional area wall is formed an internal, channel-like space and between the functional area wall and outer jacket an external, channel-like space. The two channel-like spaces can be supplied by controllable volume flows independently of one another in load-dependent manner.

15 Claims, 1 Drawing Sheet

CABINET FOR ELECTRIC AND ELECTRONIC SYSTEMS

The invention relates to an equipment cabinet, particularly a switch and control cabinet, for electrical and electronic systems with a functional area sealed in dustproof and watertight manner, having at least one door closing in dustproof and watertight manner. In the same structural form and equipment, the equipment cabinet is suitable for external use in widely differing climatic zones, e.g. temperate, arctic, subtropical and tropical zones.

Equipment cabinets are e.g. known from the publication by Gottfried Klingberg "Schaltschdrank und Gehause-Klimatisierung", (switch cabinet and case climatization), Mähling Werbung, Düsseldorf.

With the aim of ensuring a permanent, faultless operation of the electrical and electronic systems in the case of variable external climatic conditions, as a function of the functional area climatic requirements equipment cabinets are designed therein in such a way that by heat dissipation via the cabinet surface and/or by heat transfer means, the exceeding of a maximum permitted functional area temperature is prevented and the dropping below a minimum function area temperature is prevented by heaters.

DE 295 19 260 U1 discloses a weatherproof electronic equipment cabinet for installation in the open and which is at least-partly enveloped by a removable cover spaced from the outer faces of the electronic switch cabinet. The thus formed gap is linked to the external air. In the case of strong insolation, the cover is intended to reduce heating and, at low temperatures, the cooling of the cabinet.

DE-AS 11 35 065 discloses the adjustment of the air supply to the interior of the equipment by means of air openings in the equipment wall, whose cross-section is variable.

DD 212 871 is based on a known arrangement for removing heat from closed cases, in which equipment producing heat losses are arranged in several planes, which contains a heat exchanger constructed as a door, wall or part of a door or wall and through which flows the heated internal air in an internal circuit and cool external air in an external circuit, together with at least two fans, a channel being formed by a cover in the internal circuit. In order to ensure a planned heat removal from subassemblies, the inner space is subdivided by horizontal partitions into separate circuits, which are connected to the heat exchanger and equipped with separate fans.

Even in the case of relatively low internal heat loads, despite a clearly positive difference between the maximum permitted functional area temperature and the maximum external air temperature, in the known cabinets the load removal (cabinet cooling) is only possible through additional technical means, such as e.g. air-air heat transfer means, air-water coolers, refrigerating machines, etc. The fault susceptibility, as well as operational and maintenance costs of such equipment are comparatively high.

It is also disadvantageous that the function area is occupied by said coolers and it is also disadvantageous to have to constructionally adapt the functional area to the requirements of the coolers.

The object of the invention is to so arrange substantially maintenance-free elements with the components which are in any case required for the other equipment cabinet functions in such a way that in particular the "passive cooling" for the operating area is increased compared with known equipment cabinet constructions, whilst reducing maintenance and operating costs and it is also ensured that the functional area is not occupied by coolers.

According to the invention, this object is achieved with the features of claim 1. Advantageous further developments form the subject matter of subclaims 2 to 13.

It is essential to the invention that certain surface areas are so constructed in multishell manner that there is a formation on the inside and outside of channel-like spaces, relative to the functional area wall. Depending on the load situation, said channel-like spaces can be more or less intensively supplied with air or sealed in a substantially airtight manner, so that apart from cooling the functional area, a heat insulation can be obtained. Advantageously the functional area wall is equipped with a rib system, in order to increase its surface area and improve the convective heat transfer.

In the inner, channel-like space, the air flow is produced only by fans and in the outside channel-like space by fans and buoyancy. The air flow is guided by channels in the vicinity of the functional area wall and in the functional area is adapted to the heat loss sources.

The rib system is advantageously constructed in needle or strip form connected in a tight, heat-conducting manner to the functional area wall. As a function of the particular use, the rib system can project in cantilevered manner into the channel-like spaces or can be constructively externally connected to the outer jacket or internally to baffle plates. As a result the heat transfer coefficient can be further increased.

Further advantageous developments can be gathered from the subclaims.

The advantage of the inventive solution is that, accompanied by the addition of low maintenance components to the already existing equipment cabinet elements, an arrangement is provided having a "controllable" heat transfer, so that in particular the cooling, but also the heat insulation of the functional area is possible, as a function of the individual case. Energy costs are low for operation and can be covered exclusively or additionally by photovoltaic modules on or in the vicinity of the equipment cabinet. In addition, the functional area is not constricted by coolers and the operative management becomes simpler and less expensive.

The invention is described in greater detail hereinafter relative to an embodiment. FIG. 1 is a view of a longitudinally cut open construction of an inventive equipment cabinet, the essential elements being represented diagrammatically, in order to particularly stress the multishell structure of certain areas of the envelope construction.

In the embodiment, the sealed functional area wall 2 of a functional area 1 of width B, height H (and depth T), is provided in the region of the two side walls and the rear wall with a rib system 3, 4, exemplified embodiments of the latter being shown in the form of needle ribs 3 and strip ribs 4.

On the functional area side, the fan 8 used for moving the air in the functional area 1 is so connected to baffle plates 11, that the air initially scavenges the electrical equipment in the functional area 1 and in the case of cooling operation removes the power loss from the equipment and then flows along the ribbed functional area wall 2 at a relatively high speed and transfers thermal energy there to the ribbed functional area wall 2. The good heat transfer sought in the wall area in the case of cooling is achieved in that the internal air, driven by the fan 8, necessarily flows through the internal flow channel 6 formed between the baffle plates 11 and functional area wall 2 and in particular when using needle ribs 3 high heat transfer coefficients occur thereon. However, even on the unribbed wall parts between the needle ribs, due to the local turbulence, there is also an increased heat transfer coefficient level, compared with that achieved under otherwise identical conditions on a smooth wall.

In place of separate baffle plates 11, the inside flow channel 6 can at least partly be formed by the side walls of the slide-in modules.

Since for the heat transmission through the functional area wall 2 it is also necessary to have a good heat transfer to the outside, so that in the case of cooling, even with minor temperature differences between the internal and external air, better-than-average high heat flow densities can be achieved, externally in the case of cooling constructional precautions are taken in order to achieve this.

As represented in the embodiment, this is advantageously achieved in that through an outer jacket 5, which spacedly surrounds the ribbed functional area wall zones in such a way that there is an upper and lower open, external, channel-like space 6' (as on the inside), through which either by thermal buoyancy or driven by fans 8' in the roof area, external air flows from bottom to top. For cooling this external air has a lower temperature than the functional area wall 2 and dissipates most of the power loss. The fans 8, 8' can be controlled in cooling load-dependent manner.

As in the external air channel in general higher air velocities can be achieved than in the functional area, the rib system can be less high than on the inside.

The heat dissipation in the external air shaft would be reduced by insolation on the outer jacket leading to the outer jacket surface assuming higher temperatures than the air flowing in said shaft. To avoid this, either (as shown in FIG. 1) to the outside of the outer jacket 5 are applied shading-acting additional elements 10 (e.g. artificial ivy) or the outer jacket is constructed in double-wall manner, the inner surfaces of the double-wall outer jacket having lower emission coefficients for the radiant energy and the air in the double-wall outer jacket acts as a thermal insulation layer.

In order to obtain static air layers in the outer flow channel 6' for winter operation, the external flow channel 6' can be closed by flaps 7. Other precautions can be taken in place of the flaps 7. They are always operated if a change from cooling to heating or vice versa is required. A filter 12 is also provided for the external air entering the external channel-like space 6'.

The fans 8, 8' assisting cooling are advantageously supplied by photovoltaically produced electrical energy, because through adaptable variation curves of the electrical power supply and the necessary fan drive capacity control is simplified. Through photovoltaic modules 9 having the size of the roof surface and which are installed in spaced manner and therefore back-ventilated over the cabinet roof, additionally the shading of the roof area is brought about.

What is claimed is:

1. An equipment cabinet for electrical and electronic systems, comprising:

a functional area closed in dustproof and watertight manner and at least one door closing in dustproof and watertight manner, wherein a multishell structure being provided round said functional area, said multishell structure comprises baffle plates, a functional area wall and an outer jacket, an internal, channel-like space between the baffle plates and the functional are wall, and an external, channel-like space between the functional area wall and the outer jacket, wherein said two channel-like spaces can be supplied by controllable volume flows independently of one another in load-dependent manner, said volume flows being adjustable from 0 to a maximum value.

2. Equipment cabinet according to claim 1, wherein the maximum value of the volume flow in the external, channel-like space is determined by resistances in the external, channel-like space and characteristics of a fen in the external, channel-like space, wherein the maximum value of the volume flow in the internal, channel-like space is determined by resistances of functional area equipment in said functional area and the internal, channel-like space as well as by characteristics of a fan in the internal, channel-like space, and wherein consequently a heat transfer from said functional area to an exterior can be intensified or from the exterior into said functional area can be intensified or reduced.

3. Equipment cabinet according to claim 1 wherein said baffle plates are at least partly formed by side walls of slide-in modules.

4. Equipment cabinet according to claim 1 wherein in the internal channel-like space, the air-flow is produced by fans and in the external-channel-like space the air-flow is produced by thermal buoyancy or fans, or static air layers bring about an insulation.

5. Equipment cabinet according to claim 4 wherein said functional area wall at least partly has a two-sided rib system projecting into said channel-like spaces.

6. Equipment cabinet according to claim 5 wherein said rib system is constructed in the form of needles or strips, said needles or strips being connected tightly and in heat-conducting manner to the functional area wall.

7. Equipment cabinet according to claim 6 wherein the height of said needles or strips differs to the outside and inside.

8. Equipment cabinet according to claim 5 wherein on a top of the outer jacket and spaced therefrom and/or in the vicinity of the equipment cabinet are provided photovoltaic modules providing the drive energy for the fans in either a partial or complete manner.

9. Equipment cabinet according to claim 5 wherein said outer jacket has a double wall construction and insides of the double wall outer jacket have a low coefficient for radiant energy.

10. Equipment cabinet according to claim 5 wherein said outer jacket is provided with shade-giving additional elements.

11. Equipment cabinet according to claim 10 wherein said shade-giving additional elements are natural and/or artificial plants.

12. Equipment cabinet according to claim 1 wherein air from said internal, channel-like space entering said functional area is distributed by means of air entry in such a way that preferably cooling air is supplied to main loss sources.

13. Equipment cabinet according to claim 12 wherein a perforated plate is provided as means of air entry of said functional area.

14. Equipment cabinet according to claim 4 wherein at least one filter is arranged at an entry of said external, channel-like space supplying filtered external air into said external, channel-like space.

15. Equipment cabinet according to claim 4 wherein said static air-layers can be produced in said external, channel-like space by flaps, which can be closed said external, channel-like space.

* * * * *